(12) United States Patent
Ito

(10) Patent No.: US 11,069,871 B2
(45) Date of Patent: Jul. 20, 2021

(54) ORGANIC WHITE LIGHT EMITTING ELEMENT

(71) Applicant: CANON KABUSHIKI KAISHA, Tokyo (JP)

(72) Inventor: Takayuki Ito, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/502,216

(22) Filed: Jul. 3, 2019

(65) Prior Publication Data
US 2020/0013979 A1   Jan. 9, 2020

(30) Foreign Application Priority Data
Jul. 3, 2018 (JP) .............................. JP2018-126592

(51) Int. Cl.
*H01L 51/50* (2006.01)
*H01L 51/52* (2006.01)
*H01L 27/32* (2006.01)

(52) U.S. Cl.
CPC ........ *H01L 51/504* (2013.01); *H01L 51/5044* (2013.01); *H01L 51/5218* (2013.01); *H01L 51/5234* (2013.01); *H01L 51/5265* (2013.01); *H01L 27/322* (2013.01); *H01L 2251/5315* (2013.01); *H01L 2251/558* (2013.01)

(58) Field of Classification Search
CPC ............... H01L 51/5265; H01L 27/322; H01L 51/0085; H01L 51/504; H01L 51/5206; H01L 51/5221; H01L 2251/308; H01L 27/3211; C09K 11/06

USPC .............................................. 257/40, 89, 88
See application file for complete search history.

(56) References Cited

U.S. PATENT DOCUMENTS

| | | | |
|---|---|---|---|
| 8,304,096 B2 | 11/2012 | Watanabe et al. | ............ 428/690 |
| 8,471,463 B2 | 6/2013 | Sumida et al. | ............... 313/504 |
| 8,786,177 B2 | 7/2014 | Ono | |
| 9,755,165 B2 | 9/2017 | Nishide et al. | ..... H01L 51/0094 |
| 9,911,921 B2 | 3/2018 | Yamada et al. | ........ C07C 43/275 |
| 2007/0252520 A1* | 11/2007 | Hasegawa | ........... H01L 27/3211 313/504 |

(Continued)

FOREIGN PATENT DOCUMENTS

JP         2011-76769 A        4/2011

*Primary Examiner* — Jonathan Han
(74) *Attorney, Agent, or Firm* — Venable LLP

(57) ABSTRACT

Provided is an organic white light emitting element (EL) including: a reflective electrode, a light extraction electrode, and an organic layer arranged therebetween, the organic layer including: a blue light emitting layer (BL); and a long-wavelength light emitting layer, the long-wavelength light emitting layer arranged between the BL and the reflective electrode, the BL provided at such a position as to satisfy Equation given below:

$z = \varphi \times \lambda_1 / 4\pi$ where z represents an optical distance between the reflective electrode and an interface of the BL on the reflective electrode side, φ represents a phase of light reflected by the reflective electrode in an emission wavelength region of the BL, and $\lambda_1$ represents a wavelength in a visible light region, and the EL has a resonator structure defined between the reflective electrode and the light extraction electrode and has a maximum peak resonant wavelength in a blue light wavelength region.

17 Claims, 10 Drawing Sheets

(56) References Cited

U.S. PATENT DOCUMENTS

| | | | |
|---|---|---|---|
| 2007/0257609 A1* | 11/2007 | Fukuda | H01L 51/5284 |
| | | | 313/506 |
| 2008/0054797 A1* | 3/2008 | Furugori | C09K 11/06 |
| | | | 313/504 |
| 2010/0244062 A1* | 9/2010 | Ueno | H01L 51/5036 |
| | | | 257/90 |
| 2012/0181921 A1 | 7/2012 | Ono | |
| 2014/0014930 A1* | 1/2014 | Hirose | H01L 51/0074 |
| | | | 257/40 |
| 2015/0008409 A1 | 1/2015 | Ito et al. | 257/40 |
| 2017/0033317 A1* | 2/2017 | Kajimoto | H01L 51/504 |

* cited by examiner

ORGANIC WHITE LIGHT EMITTING ELEMENT

BACKGROUND OF THE INVENTION

Field of the Invention

The present disclosure relates to an organic white light emitting element.

Description of the Related Art

In recent years, as a substitute for electronic functional elements made of an inorganic compound, an application of organic electronic elements has been examined. Those organic electronic elements are made of an organic compound that allows for film formation by coating or a low-temperature process. In particular, organic light emitting elements, also called organic electroluminescence elements or organic EL elements, have been developed rapidly. Full-color display of a display apparatus requires primary colors including red (R), green (G), and blue (B). The primary colors R, G, and B can be obtained, for example, by a method of arranging light emitting layers that emit red light, green light, and blue light on a sub-pixel basis or by a method of allowing light from a white light emitting element to pass through an RGB color filter so as to obtain different colors. In recent years, development of full-color display apparatus has been headed for multi-pixel and high-definition display. Hence, the above-mentioned method of arranging three organic RGB light emitting layers is difficult to deal with refinement or high-precision positional alignment of a highly fine mask, thereby resulting in a problem of a low yield. In contrast, the method that employs the white light emitting element and the RGB color filter requires no highly fine mask to obtain different colors and thus is effective to improve a yield. In Japanese Patent Application Laid-Open No. 2011-76769, it is proposed to allow each light emitting layer to emit light at a position suitable for each color in order to improve an emission efficiency of the white light emitting element.

The element structure disclosed in Japanese Patent Application Laid-Open No. 2011-76769, which aims to improve the emission efficiency of the white light emitting element, is effective for efficient power consumption of a display. However, it is difficult to manufacture an element in consideration of, for example, control of film thicknesses of light emitting layers for R, G, and B, controllability for a dopant concentration of light emitting molecules, an interference design that ensures a wide color gamut, and optimization of a probability of charge recombination in each light emitting layer. Consequently, a yield thereof is reduced. Further, color purity cannot be easily increased because wide-spectrum light is emitted, which is unique to an organic material. It is accordingly difficult to enable a color gamut required for a display as well as to reduce a viewing angle dependency thereof.

SUMMARY OF THE INVENTION

According to at least one embodiment of the present invention, there is provided an organic white light emitting element including: a reflective electrode, an organic layer, and a light extraction electrode, which are formed in the stated order, wherein the organic layer includes: a blue light emitting layer including a light emitting molecule that emits blue light; and a long-wavelength light emitting layer including a light emitting molecule that emits red light and a light emitting molecule that emits green light, wherein the long-wavelength light emitting layer is arranged between the blue light emitting layer and the reflective electrode, wherein the blue light emitting layer is provided at such a position as to satisfy Equation (1) given below:

$$z = \varphi \times \lambda_1 / 4\pi \qquad (1)$$

where z represents an optical distance between the reflective electrode and an interface of the blue light emitting layer on the reflective electrode side, $\varphi$ represents a phase of light reflected by the reflective electrode in an emission wavelength region of the blue light emitting layer, and $\lambda_1$ represents a wavelength in a visible light region, and wherein the organic white light emitting element has a resonator structure defined between the reflective electrode and the light extraction electrode and has a maximum peak resonant wavelength in a blue light wavelength region.

Further features of the present invention will become apparent from the following description of exemplary embodiments with reference to the attached drawings.

DESCRIPTION OF THE EMBODIMENTS

Figure 1A:
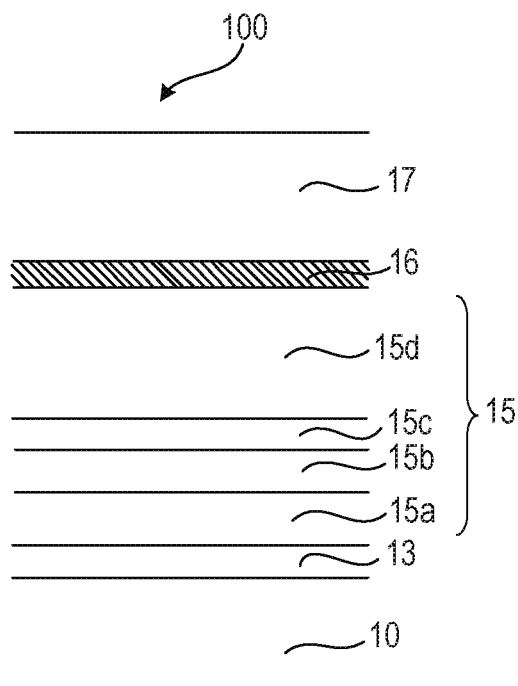
FIG. 1A is a cross-sectional schematic view for illustrating an example of an organic white light emitting element according to an embodiment of the present invention.

Preferred embodiments of the present invention will now be described in detail in accordance with the accompanying drawings. Note that in the drawings, dimensions of individual components are different from actual ones. Further, a well-known or common technology is applicable to components that are not particularly illustrated in the drawings or specified in this specification.

<<Organic White Light Emitting Element>>

Figure 1B:
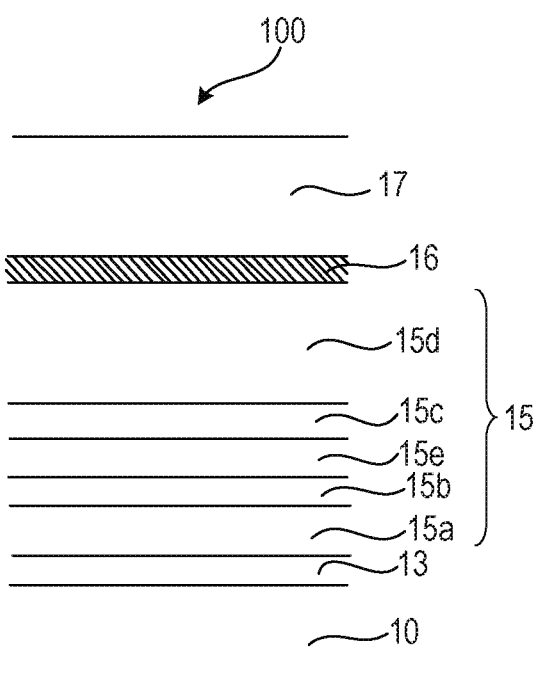
FIG. 1B is another cross-sectional schematic view for illustrating one example of the organic white light emitting element according to the embodiment of the present invention.

An organic white light emitting element according to at least one embodiment of the present invention is described in detail. FIG. 1A and FIG. 1B are cross-sectional schematic views for illustrating an example of an organic white light emitting element 100 according to an embodiment of the present invention. The organic white light emitting element 100 of FIG. 1A and FIG. 1B includes a reflective electrode 13, an organic layer 15, and a light extraction electrode 16, which are arranged in the stated order on a substrate 10. The organic white light emitting element 100 emits white light. The organic layer 15 includes a blue light emitting layer 15c and a long-wavelength light emitting layer 15b. The blue light emitting layer 15c contains a light emitting molecule that emits blue light. The long-wavelength light emitting layer 15b contains a light emitting molecule that emits red light and a light emitting molecule that emits green light. The long-wavelength light emitting layer 15b is arranged between the blue light emitting layer 15c and the reflective electrode 13. On the light extraction electrode 16, a transparent sealing layer 17 is formed, which protects the organic light emitting element from moisture or oxygen in an external environment.

<Reflective Electrode 13>

The reflective electrode 13 is preferably formed of a metal material having a reflectivity of 80% or more. Specific example thereof is an alloy produced by adding Si, Cu, Ni, Nd, or Ti into metal such as Al and Ag.

The reflectivity used herein refers to a reflectivity with respect to a wavelength of light emitted from the light emitting layer. Further, a barrier layer may be formed on a surface of the reflective electrode 13 on a light extraction side. Preferred materials for the barrier layer are metals such as Ti, W, Mo, and Au and alloys thereof. The barrier layer preferably has a thickness of 1 nm or more and 10 nm or less.

<Organic Layer 15>

The organic layer 15 may have a multilayer structure as illustrated in FIG. 1A and FIG. 1B. For example, in a case where the reflective electrode 13 is an anode, the organic layer 15 in the element of FIG. 1A may include a hole transporting layer 15a, a white light emitting layer made up of a long-wavelength light emitting layer 15b and blue light emitting layer 15c, and an electron transporting layer 15d. It is possible to suitably form, for example, a hole injection layer, an electron blocking layer, a hole blocking layer, and an electron injection layer in the organic layer 15. The electron injection layer can be formed of a well-known material, e.g., an inorganic substance such as LiF, CsF, $Cs_2CO_3$, or $Li_2O$, or lithium complex such as lithium quinolinol (Liq).

The electron transporting layer 15d can be formed of a well-known electron-transportable material. Conceivable examples thereof include phenanthroline derivative and quinolinol complex. A hole blocking layer may be suitably formed between the electron transporting layer 15d and the blue light emitting layer 15c. The hole blocking layer is preferably formed of a wide-gap material such as polycyclic aromatic hydrocarbon or heterocyclic aromatic substance.

The hole transporting layer 15a can be formed of a well-known hole-transportable material. Conceivable examples thereof include triarylamine derivatives, carbazole derivatives, and thiophene derivatives. An electron blocking material can be suitably arranged between the hole transporting layer 15a and the long-wavelength light emitting layer 15b. The electron blocking material is preferably one having (absolute value of) LUMO lower than that of the light emitting layer, and is particularly preferably carbazole derivative or triarylamine derivative. Moreover, a hole injection layer may be arranged between the reflective electrode 13 and the hole transporting layer 15a; the hold injection layer is made of a material such as molybdenum oxide or tetracyanoquinodimethane (F4-TCNQ), which has a high ability to attract electrons.

The hole transporting layer 15a and the electron transporting layer 15d may have a desired optical film thickness that satisfies an interference condition described later. Although a preferred physical film thickness for the hole transporting layer 15a is 10 nm or more and 50 nm or less, and a preferred physical film thickness for the electron transporting layer 15d is 100 nm or more and 150 nm or less, those values may vary depending on the number of stacked layers and optical characteristics of each layer.

The light emitting layer includes the long-wavelength light emitting layer 15b and the blue light emitting layer 15c. As illustrated in FIG. 1B, a spacer 15e may be arranged suitably between the long-wavelength light emitting layer 15b and the blue light emitting layer 15c in order to adjust a balance of light emission from the light emitting layers. The long-wavelength light emitting layer 15b contains at least a green light emitting molecule and a red light emitting molecule. The long-wavelength light emitting layer 15b and the blue light emitting layer 15c can be obtained by suitably applying, through co-deposition, light emitting molecules of each color to a host material in a predetermined dopant concentration. The blue light emitting layer 15c preferably contains blue light emitting molecules in a dopant concentration of 0.1 wt % or more and 10 wt % or less with respect to the host material. The long-wavelength light emitting layer 15b preferably contains green light emitting molecules in a dopant concentration of 0.5 wt % or more and 10 wt % or less and contains red light emitting molecules in a dopant concentration of 0.5 wt % or more and 5 wt % or less. The long-wavelength light emitting layer 15b can be formed by ternary deposition. In view of control of a light emitting region and the balance of light emission, it is preferred to form the long-wavelength light emitting layer 15b and the blue light emitting layer 15c with a film thickness of 1 nm or more and 30 nm or less although not particularly limited.

The blue light emitting molecule can be a well-known one. The light emitting molecule preferably has an emission peak at a wavelength of around 440 nm to 480 nm. The green light emitting molecule can be a well-known one. The green light emitting molecule preferably has an emission peak at a wavelength of around 515 nm to 550 nm. The red light emitting molecule can be a well-known one. The red light emitting molecule preferably has an emission peak at a wavelength of around 600 nm to 640 nm. Each light emitting molecule may be a fluorescent light-emitting material, a phosphorescent light-emitting material, or a delayed fluorescent light-emitting material. The host materials of the long-wavelength light emitting layer 15b and the blue light emitting layer 15c can be suitably selected from well-known materials. The host material can be a polycyclic compound or a heterocyclic compound such as anthracene derivative, pyrene derivative, carbazole derivative, and amine derivative. Further, the host material can be selected suitably depending on the light emitting molecule. It is preferred to employ a host material that is suitable for light emission of the blue light emitting molecule because such a host material can be used also for the long-wavelength light emitting layer 15*b*.

The light emitting molecule may preferably have fluoranthene skeleton, anthracene skeleton, pyrene skeleton, or fluorene skeleton. Among those, the fluoranthene skeleton is preferred and a ring structure thereof is more preferred.

<Light Extraction Electrode 16>

The light extraction electrode 16 is an electrode on a light extraction side. The light extraction electrode 16 is formed of a metal thin film made of, for example, Al, Ag, or an Ag alloy. As the metal thin film, an Ag alloy thin film can be used, which contains alkaline earth metal such as magnesium (Mg) or calcium (Ca). Alternatively, the film may contain Ag alone. The light extraction electrode 16 preferably has a film thickness that ensures a reflectivity of 8% or more with respect to incident light from the organic layer 15 side in a visible light region, in order to increase a value of a resonance peak as described below. The film thickness is particularly preferably 5 nm or more and 30 nm or less, in view of transmittance.

<Transparent Sealing Layer 17>

The transparent sealing layer 17 is formed on the light extraction electrode 16 in order to protect the organic layer 15 from oxygen or moisture in an external environment. Further, the transparent sealing layer 17 is formed of a material having an extremely low permeability to oxygen or moisture in the external environment, such as silicon nitride or silicon oxynitride. The transparent sealing layer 17 serves to not only protect the light emitting element but also protect the element during a process of providing a color filter.

<Interference Design>

The organic light emitting element according to the embodiment of the present invention has a resonator structure that is defined between the reflective electrode 13 and the light extraction electrode 16. The organic light emitting element has a maximum peak resonance wavelength in a blue light wavelength region. White light produced from blue light, green light, and red light emitted from the light emitting layer causes optical interference between the light emitting layer and the reflective electrode 13 and between the reflective electrode 13 and the light extraction electrode 16. At this time, it is preferred that an optical distance from the reflective electrode 13 to the light extraction electrode 16 be set such that a maximum resonance peak appears around a blue light wavelength region (preferably 430 nm or more and 490 nm or less, more preferably 440 nm or more and 480 nm or less) in a visible light region. Specifically, it is preferred to determine a wavelength corresponding to the maximum resonance peak as represented by Equation (2) below:

$$L=(\Sigma\varphi+2m\pi)\times\lambda_2/4\pi \quad (2)$$

where L represents an optical distance between the reflective electrode 13 and the light extraction electrode 16 at a wavelength $\lambda_2$, $\varphi$ represents the sum of phases of light reflected by the reflective electrode 13 and light reflected by the light extraction electrode 16 at the wavelength $\lambda_2$, m represents an integer of 0 or 1, and $\lambda_2$ represents the wavelength in the blue light wavelength region (preferably 430 nm or more and 490 nm or less, more preferably 440 nm or more and 480 nm or less).

With the interference conditions given above, in the light emitted from the light emitting layer in the organic layer 15, the wavelength of light emitted from the blue light emitting molecule is intensified. Thus, a resonance effect of the wavelengths of the light emitted from the green light emitting molecule and that from the red light emitting molecule can be reduced as compared with a resonance effect obtained in the blue light emission wavelength region. As a result, light emission intensities of green light and red light, which have high luminosity, are reduced relative to that of blue light. It is accordingly possible to reduce leakage of green light and red light from a blur color filter and consequently to ensure a blue chromaticity with high purity and a wide gamut. When L is converted into a physical film thickness, it is preferred, in terms of a balance of reflective index, to set the physical film thickness of the organic layer 15 to 70 nm or more and 100 nm or less when m=0, or to 150 nm or more and 220 nm or less when m=1.

In the organic light emitting element according to the embodiment of the present invention, the blue light emitting layer 15*c* is arranged at such a position as to satisfy Equation (1) below:

$$z=\varphi\times\lambda_1/4\pi \quad (1)$$

where z represents an optical distance between the reflective electrode 13 and an interface on the reflective electrode side, of the blue light emitting layer 15*c*, $\varphi$ represents a phase of light reflected by the reflective electrode 13 in the emission wavelength region of the blue light emitting layer 15*c*, and $\lambda_1$ represents a wavelength in a visible light region (preferably 400 nm or more and 700 nm or less).

The long-wavelength light emitting layer 15*b* is arranged between the blue light emitting layer 15*c* and the reflective electrode 13. The long-wavelength light emitting layer 15*b* is preferably arranged at such a position as to satisfy Equation (3) below:

$$z'=\varphi'\times\lambda_3/4\pi \quad (3)$$

where z' represents an optical distance between the reflective electrode 13 and an interface of the long-wavelength light emitting layer 15*b* on the light extraction electrode side, $\varphi'$ represents a phase of light reflected by the reflective electrode 13 in the emission wavelength region of the green light emitting molecule in the long-wavelength light emitting layer 15*b*, and $\lambda_3$ represents a wavelength (preferably 560 nm or less) not longer than those of the green light wavelength region.

With this arrangement, when $\lambda_1$ is equal to or longer than the peak emission wavelength of the blue light emitting layer 15*c*, and $\lambda_3$ is shorter than the peak emission wavelength of the green light emitting molecule in the long-wavelength light emitting layer 15*b*, the interference with the green light and the red light emitted from the long-wavelength light emitting layer 15*b* and reflected by the reflective electrode 13 can be further weakened. This is because the long-wavelength light emitting layer 15*b* is arranged optically closer to the reflective electrode 13 than the blue light emitting layer 15*c* is to the reflective electrode 13, to thereby weaken a resonance effect with light reflected by the reflective electrode 13 in a wavelength region of green light or red light emitted from the long-wavelength light emitting layer 15*b*. As a result, it is possible to effectively reduce an emission intensity in the green and red light wavelength regions with respect to that in the blue light wavelength region. Thus, in a spectrum of light, which is emitted from the organic light emitting element and has passed through the RGB color filter, high purity of each color and a wide color gamut can be ensured. Further, in order to suitably enhance the reflection with respect to green light and red light so as to improve an emission efficiency of the element, it is preferred to set $\lambda_1$ longer than the peak emission wavelength of the blue light emitting layer 15*c*. In addition, the interference design above allows effectively reducing a viewing angle dependency.

Next, an effect of reducing the viewing angle dependency according to the embodiment of the present invention is described. The intensity of resonance effect by a resonance structure of the organic light emitting element is represented by Equation (4) below:

$$G \propto \cos(\varphi + 4\pi \times z \times \cos\Theta/\lambda_4)/(A - \cos(\Sigma\varphi - 4\pi \times L \times \cos\Theta/\lambda_4)) \quad (4)$$

where G represents an intensity of resonance effect, A represents a coefficient, Θ represents an emission angle relative to the normal to the reflective electrode surface, φ is a phase of light reflected by the reflective electrode 13 at a wavelength $\lambda_4$, z represents an optical distance between the reflective electrode 13 and an interface of the blue light emitting layer 15c on the reflective electrode 13 side under the condition of the wavelength $\lambda_4$, Σφ represents the sum of phases of light reflected by the reflective electrode 13 and light reflected by the light extraction electrode 16 at the wavelength $\lambda_4$, and L represents an optical distance between the reflective electrode 13 and the light extraction electrode 16 at the wavelength $\lambda_4$.

In Equation (4) given above, the numerator of the right-hand side indicates an interference condition for reflection in a region from the light emitting layer to the reflective electrode 13 and the denominator indicates an interference condition for reflection in all the layers of the organic layer 15. For example, in a case of increasing G with a certain wavelength $\lambda_4$, G can be increased by maximizing the numerator of the right-hand side of Equation (4) given above and minimizing the denominator thereof.

In general, the reason the viewing angle characteristics deteriorate is that an optical distance becomes short in a case of emitting light in a direction Θ oblique to the normal to the reflective electrode surface, as compared with a case of emitting light in a vertical direction. The shorter optical distance means that a peak resonance wavelength, which is designed for light incident in a front direction, is shifted to a short wavelength side in a case where light enters in an oblique direction (as a value of "z×cos Θ, L×cos Θ" in Equation (4) given above is decreased, the wavelength $\lambda_4$ in the interference condition is accordingly shortened). Meanwhile, as Θ is increased, the interference is enhanced in the red light wavelength region. This is because the resonance occurs in the red light wavelength region having a low interference order. For example, when $\lambda_2$ is a wavelength of around 800 nm, L is approximately 315 nm under the condition that m is 0 in Equation (2). This optical distance is equivalent to that (L=365 nm) obtained when $\lambda_2$ is 440 nm under the condition that m is 1 in Equation (2) given above.

Figure 2A:
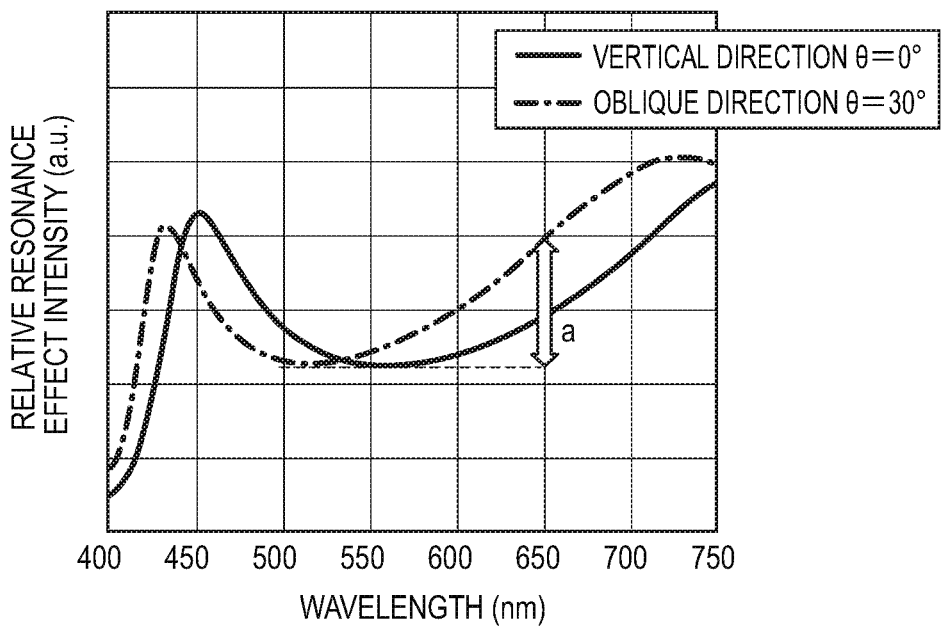
FIG. 2A is a graph for illustrating a relationship between a resonance effect intensity and a wavelength.
Figure 2B:
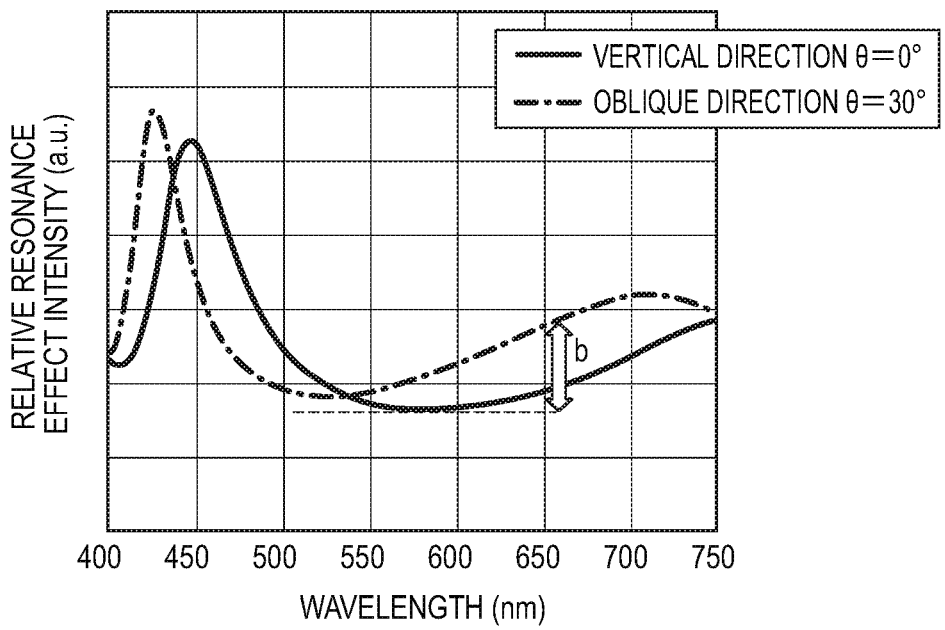
FIG. 2B is another graph for illustrating the relationship between a resonance effect intensity and a wavelength.

The above-mentioned structure is described in detail based on simulation results of FIG. 2A and FIG. 2B. FIG. 2A and FIG. 2B are graphs for showing a relationship between a resonance effect intensity and wavelengths of light incident in a front (vertical) direction and that incident in an oblique direction. FIG. 2A is a graph for showing a result of simulating an element in which the blue light emitting layer 15c is arranged between the long-wavelength light emitting layer 15b and the reflective electrode 13. FIG. 2B is a graph for illustrating results of simulating an element according to the embodiment of the present invention.

In FIG. 2A, as the optical distance L is decreased due to the light being obliquely incident at the angle of 30°, the interference condition is more likely to match that for the red light wavelength region having a low interference order. Thus, the interference intensity is largely changed around the green to red light wavelength regions (as indicated by "a" of FIG. 2A). Thus, an EL spectrum of obliquely emitted light in the green to red light wavelength regions, is considerably shifted from that of light emitted in the front direction. Consequently, the balance of emission intensity among blue light, green light, and red light is lost and the viewing angle characteristics are deteriorated.

In contrast, according to the embodiment of the present invention, the long-wavelength light emitting layer 15b is arranged between the blue light emitting layer 15c and the reflective electrode 13 in accordance with Equation (1) that defines where to arrange the blue light emitting layer 15c. With this arrangement, regarding the green light and the red light emitted from the long-wavelength light emitting layer 15b in the front direction, the condition of enhancing the reflection by the reflective electrode 13 is not applied (the numerator of Equation (4) can be decreased). In this case, it is less required to apply the condition given above to the light incident in the oblique direction (the numerator of Equation (4) can be more decreased). Thus, as illustrated in FIG. 2B, a change "b" in interference intensity in the long-wavelength region becomes smaller than "a" of FIG. 2A. Accordingly, a change in resonance effect intensity of obliquely incident light is reduced in the green to red light wavelength regions. A change in intensity of each of green light and red light emitted in the oblique direction can be reduced, and hence it is possible to reduce color misregistration that occurs due to the change in resonance effect caused in the green and red light wavelength regions. Hence, an improvement of viewing angle characteristics can be expected.

Further, according to the embodiment of the present invention, the green light emitting molecule and the red light emitting molecule both emit light in the long-wavelength light emitting layer 15b. Thus, even if a balance of charge injection or electron recombination is changed, the emission positions of the green light and the red light are not changed separately. Hence, the interference design can be more simplified, and a change in balance of light emission, which is caused by the change of a balance of charge injection or electron recombination, can also be reduced, leading to an improvement in yield.

With the interference design described above, it can be confirmed whether a suitable interference position is obtained, by emitting light substantially vertically to a produced element and observing an absorption peak with respect to reflection spectrum. By taking into account, for example, the reflectivity of light on the incident side surface and a medium of the layer, it is possible to determine a position at which the resonance is maximized. Further, a physical film thickness can also be determined by measuring a thickness of an organic film on a cross-sectional SEM image, for example.

<<Apparatus that Employs Organic Light Emitting Element>>

Emission brightness of the organic light emitting element according to this embodiment is controlled by a TFT as an example of a switching element. Through arrangement of a plurality of organic light emitting elements, images can be displayed at different levels of emission brightness. Note that the switching element of this embodiment is not limited to the TFT but can be a transistor, an MIM element, or an active matrix driver formed on a Si substrate or other such substrate. The phrase "on the substrate" encompasses a state of being "in the substrate". Whether to arrange the element on the substrate or in the substrate can be determined depending on the resolution; for example, in a case of using the resolution equivalent to QVGA (per inch), it is preferred to provide the organic light emitting element on the Si substrate. Through driving of a display apparatus that employs the organic light emitting element according to this embodiment, images can be displayed stably even for a long time with high quality.

<Display Apparatus>

Figure 3:
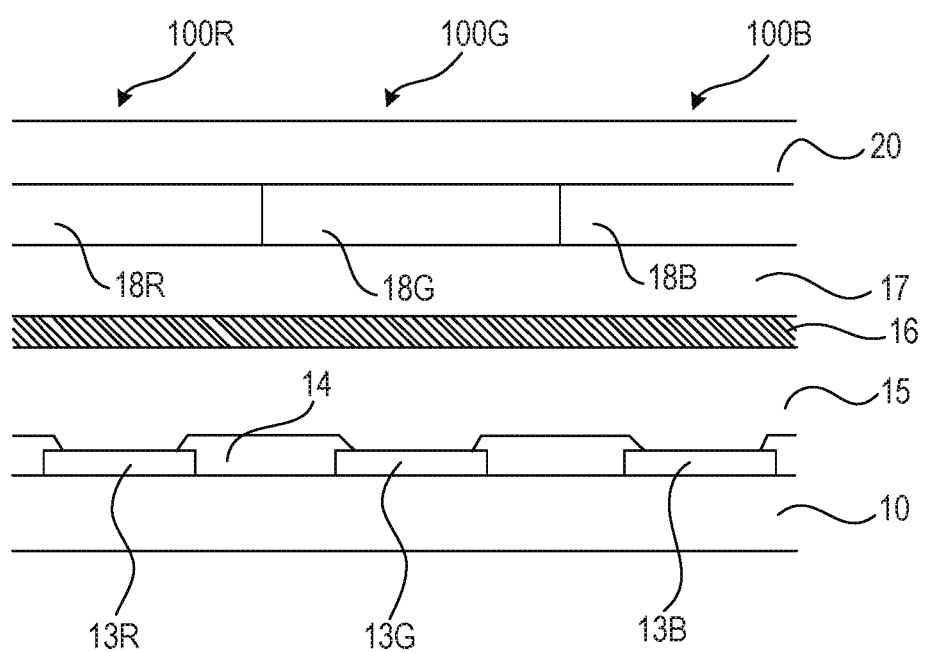
FIG. 3 is a cross-sectional schematic view for illustrating an example of a display apparatus according to the embodiment of the present invention.

FIG. 3 is a cross-sectional schematic view for illustrating an example of a full-color top-emission display apparatus that employs the organic light emitting element according to this embodiment. The display apparatus includes a number of organic light emitting elements 100 (100R, 100G, and 100B) arranged in matrix on the substrate 10. Those organic light emitting elements 100 are separated by banks 14. This embodiment adopts the top emission type, and hence the substrate 10 can be transparent or opaque. In the reflective electrodes 13 (13R, 13G, and 13B) as pixel electrode, and the light extraction electrode 16, wirings (not illustrated) are provided to supply power and induce light emission. In the organic light emitting elements 100, color filters 18 (18R, 18G, and 18B) that selectively transmit red (R) light, green (G) light, and blue (B) light, are provided in correspondence with pixels of red, green, and blue, to thereby obtain a red light emitting element (100R), a green light emitting element (100G), and a glue light emitting element (100B). Regarding the arrangement of the color filters 18 corresponding to red, green, and blue, delta arrangement is applicable. On the color filters 18, a transparent protective substrate 20 may be provided in order to protect the top surface thereof.

Figure 4:
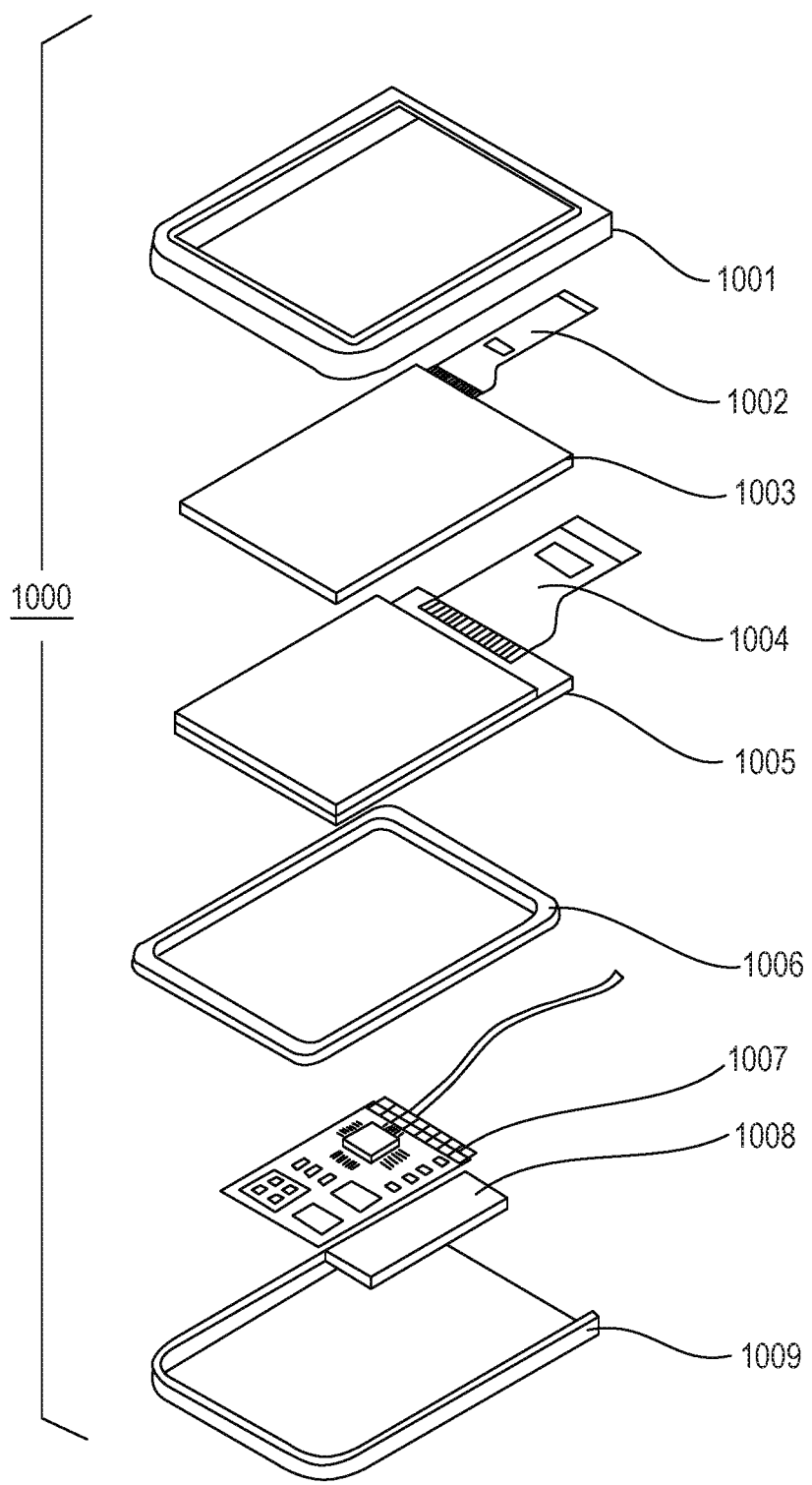
FIG. 4 is a schematic view for illustrating an example of the display apparatus according to the embodiment of the present invention.

FIG. 4 is a schematic view for illustrating an example of a display apparatus according to the embodiment of the present invention. A display apparatus 1000 may include a touch panel 1003, a display panel 1005, a frame 1006, a circuit board 1007, and a battery 1008 between an upper cover 1001 and a lower cover 1009. The touch panel 1003 and the display panel 1005 are connected to flexible printed circuits (FPCs) 1002 and 1004, respectively. The display panel 1005 may be the organic light emitting element according to this embodiment. The circuit board 1007 has a transistor printed thereon. The battery 1008 can be omitted when the display apparatus is not a mobile phone. Further, even when the battery 1008 is a mobile phone, its position is not limited to the illustrated one.

Figure 5A:
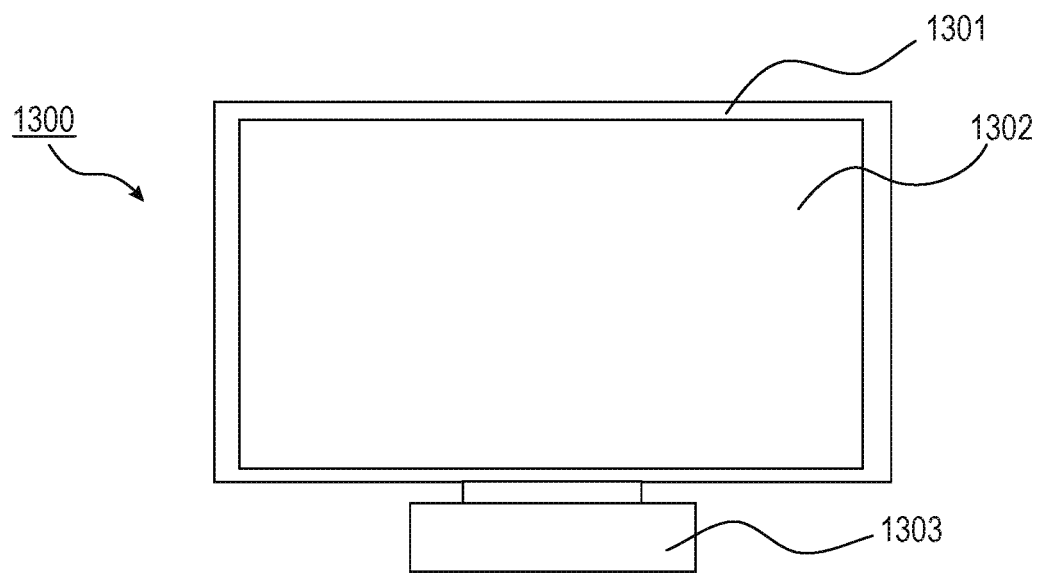
FIG. 5A is a schematic view for illustrating an example of the display apparatus according to the embodiment of the present invention.
Figure 5B:
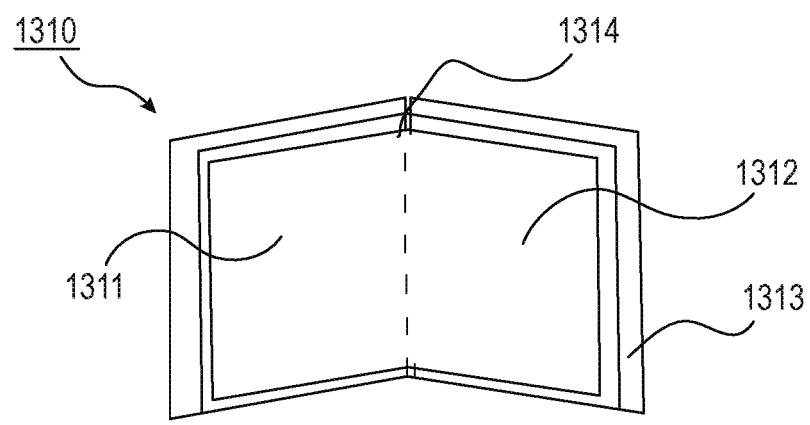
FIG. 5B is another schematic view for illustrating an example of the display apparatus according to the embodiment of the present invention.

FIG. 5A and FIG. 5B are schematic views for illustrating an example of a display apparatus according to this embodiment. In FIG. 5A, a display apparatus such as a TV monitor and a PC monitor is illustrated. The display apparatus 1300 includes a frame 1301 and a display unit 1302. The organic light emitting element according to this embodiment is applicable to the display unit 1302. Further, the display apparatus 1300 includes a base 1303 that supports the frame 1301 and the display unit 1302. The base 1303 is not limited to the shape illustrated in FIG. 5A. In this regard, a lower side of the frame 1301 can serve as the base. Alternatively, the frame 1301 and the display unit 1302 may be curved. In this case, the radius of curvature may be 5000 mm or more and 6000 mm or less. A display apparatus 1310 of FIG. 5B has a foldable structure and thus is a so-called foldable display apparatus. The display apparatus 1310 includes a first display unit 1311, a second display unit 1312, and a casing 1313, and has a bending point 1314. The first display unit 1311 and the second display unit 1312 may include the organic light emitting element according to this embodiment. Further, the first display unit 1311 and the second display unit 1312 may constitute a single seamless display apparatus. The first display unit 1311 and the second display unit 1312 can be divided along the bending point. The first display unit 1311 and the second display unit 1312 may display different images or a single image.

<Image Pickup Apparatus>

The display apparatus according to the this embodiment is applicable to a display unit of an image pickup apparatus including an optical unit having a plurality of lenses and an image pickup element configured to receive light that has passed through the optical unit. The image pickup apparatus may include a display unit configured to display information obtained by the image pickup element. Further, the display unit may be exposed to an outside of the image pickup apparatus or provided within a finder. The image pickup apparatus may be a digital camera or a digital video camera.

Figure 6:
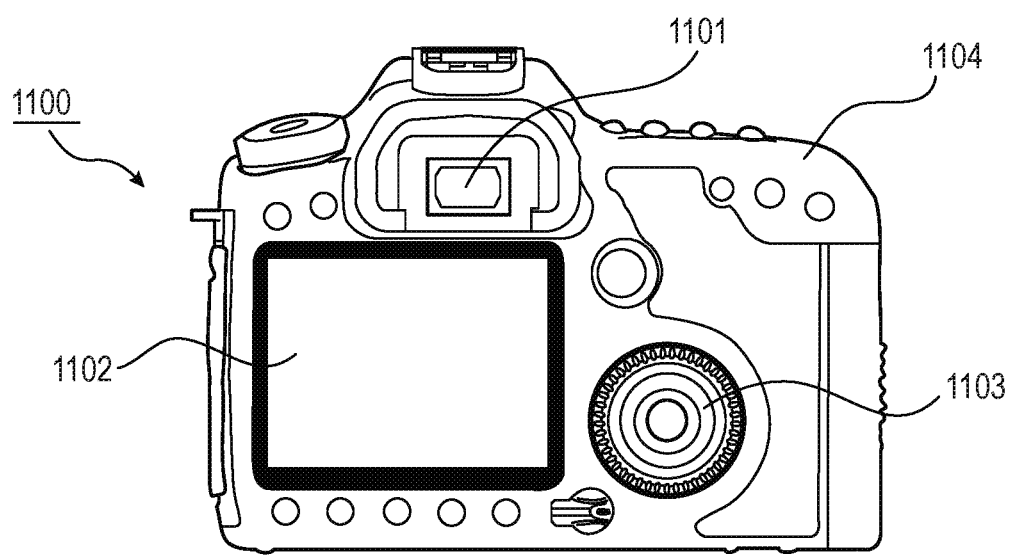
FIG. 6 is a schematic view for illustrating an example of an image pickup apparatus according to the embodiment of the present invention.

FIG. 6 is a schematic view for illustrating an example of an image pickup apparatus according to this embodiment. An image pickup apparatus 1100 may include a view finder 1101, a rear display 1102, a casing 1103, and an operation unit 1104. The view finder 1101 may include the display apparatus according to the embodiment of the present invention. In this case, the display apparatus may display not only a captured image but also environmental information or an instruction to capture an image, for example. The environmental information may indicate, for example, an intensity of external light, a direction in which external light impinges on a subject, a speed at which the subject moves, and a possibility of the subject being hidden by any object. A preferred time for image pickup is very short, and hence the information is required to be displayed as quickly as possible. For that purpose, the display apparatus that employs the organic light emitting element according to this embodiment is preferably used because the organic light emitting element realizes a high response speed. The display apparatus that employs the organic light emitting element according to this embodiment can be preferably used for an apparatus that requires a high display speed, as compared with a liquid crystal display apparatus. The image pickup apparatus 1100 includes an optical unit (not shown). The optical unit includes a plurality of lenses configured to form an image on an image pickup element held in the casing 1103. Through adjustment of a positional relationship between the plurality of lenses, a focal point thereof can be controlled. This operation can be performed automatically.

<Mobile Device>

The display apparatus according to this embodiment is applicable to a display unit of a mobile device such as a mobile terminal. In this case, the display apparatus may have both of a display function and an operation function. Conceivable examples of the mobile terminal include a mobile phone such as a smartphone, a tablet, and a head mounted display.

Figure 7:
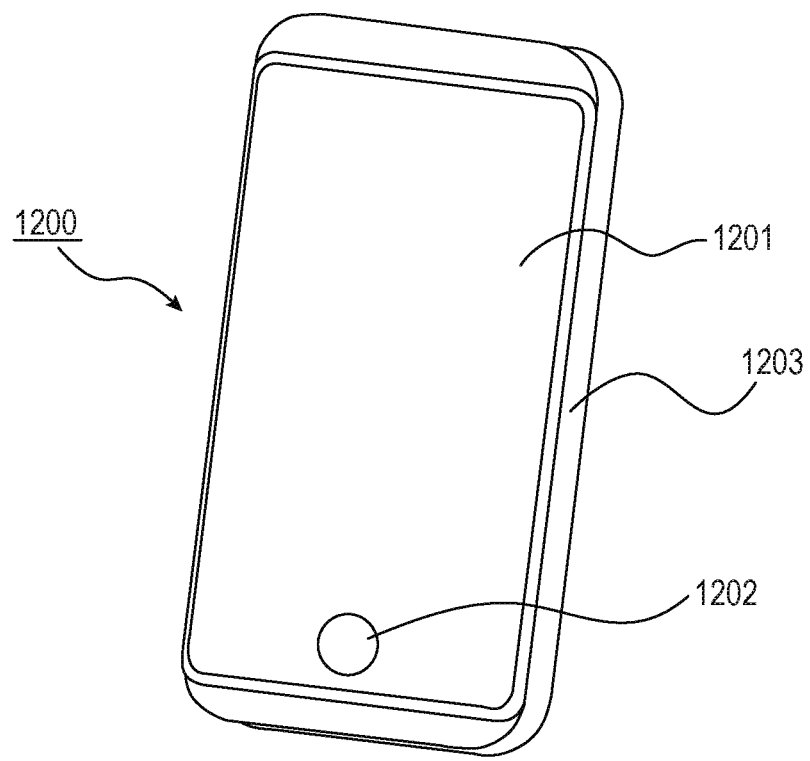
FIG. 7 is a schematic view for illustrating an example of a mobile device according to the embodiment of the present invention.

FIG. 7 is a schematic view for illustrating an example of a mobile device according to the embodiment of the present invention. A mobile device 1200 includes a display unit 1201, an operation unit 1202, and a casing 1203. The casing 1203 may include a circuit, a printed board with the circuit, a battery, and a communication unit. The operation unit 1202 may be a button or a touch panel reaction unit. Alternatively, the operation unit may be a biometric authentication unit configured to authenticate a user's fingerprint for unlocking, for example. Further, the mobile device including a communication unit may be used as a communication apparatus.

<Lighting Apparatus>

Figure 8:
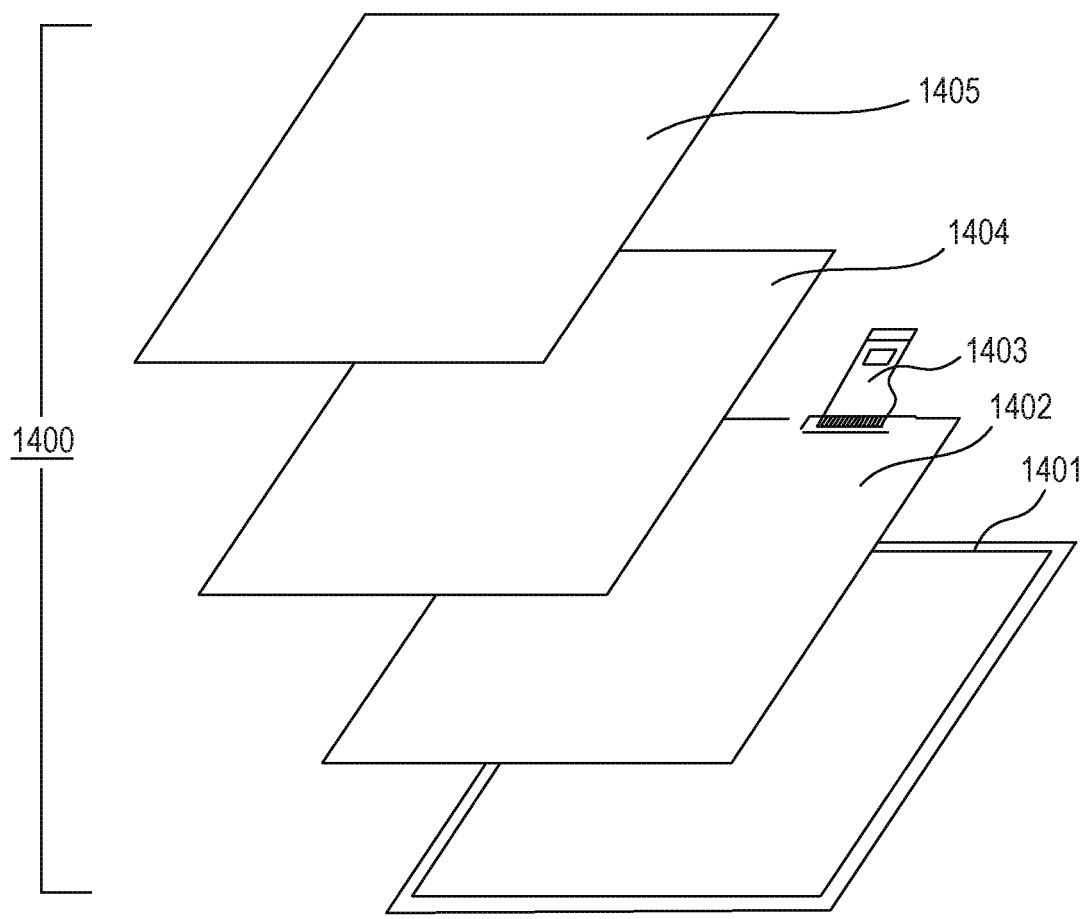
FIG. 8 is a schematic view for illustrating an example of a lighting apparatus according to the embodiment of the present invention.

FIG. 8 is a schematic view for illustrating an example of a lighting apparatus according to the embodiment of the present invention. A lighting apparatus 1400 may include a casing 1401, a light source 1402, a circuit board 1403, an optical filter 1404, and a light diffusing unit 1405. The light source 1402 may include the organic light emitting element according to this embodiment. The optical filter 1404 may be a filter capable of improving color rendering property of the light source 1402. The light diffusing unit 1405 allows for effective diffusion of light from the light source 1402, e.g., light-ups, by which light can reach a wide area. A cover may be provided at an outermost portion thereof as required.

The lighting apparatus is to illuminate a room, for example. The lighting apparatus may emit white light, neutral white light, or any other color light in a range from blue to red. The lighting apparatus may include a light control circuit configured to control the color light. Further, the lighting apparatus may include the organic light emitting element according to this embodiment and a power supply circuit connected thereto. The power supply circuit is to convert an AC voltage to a DC voltage. The white and neutral white used herein are defined as ones having color temperature of 4,200K and 5,000K, respectively. The lighting apparatus may include a color filter.

EXAMPLES

Example 1

Optical characteristics of the organic light emitting element of FIG. 1A were evaluated by simulation.

Conditions for the simulation are described. The reflective electrode 13 was a 60 nm-thick aluminum film that serves as a reflective layer having a high reflectivity. The film thickness of each of the long-wavelength light emitting layer 15*b* and the blue light emitting layer 15*c* was 10 nm. The film thickness of each of the hole transporting layer 15*a* and the electron transporting layer 15*d* was set as follows. That is, under the precondition that a blue component in the spectrum of light that has passed through an RGB color filter has a luminous intensity CIE_y of 0.06, which is defined by the CIE1931 color space, an intensity ratio between R light, G light, and B light for producing white light was estimated from the emission spectra of the R light, the G light, and the B light. Based on the estimated value, the film thickness is set so as to minimize power consumption. The light extraction electrode 16 was made of an MgAg alloy with a film thickness of 10 nm. As the transparent sealing layer 17, an SiN film was used. The simulation was performed by examining an EL emission spectrum of light emitted into the transparent sealing layer 17.

Figure 9A:
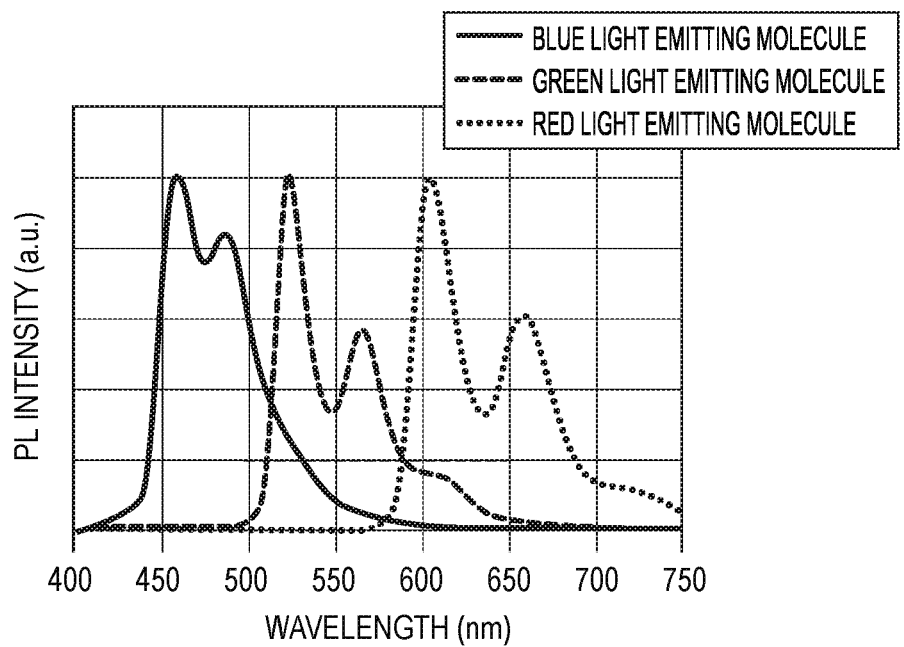
FIG. 9A is a graph for illustrating a fluorescence spectrum of each light emitting molecule used in simulation.
Figure 10:
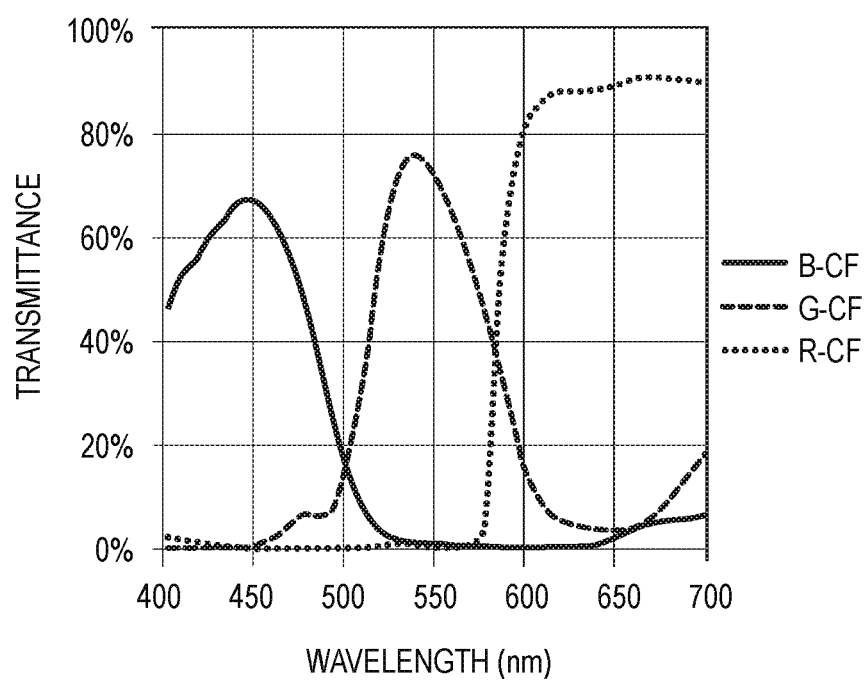
FIG. 10 is a graph for illustrating transmission characteristic of a color filter used in simulation.

The simulation was performed on the assumption that the light emitting molecules emit light in which the same number of photons are included in the light emitting layers. Then, the fluorescence spectrum of each light and the resonance effect produced between the reflective electrode 13 and the light extraction electrode 16 were estimated and multiplied, to thereby simulate the EL emission spectrum. The respective fluorescence spectra of light emitted from the light emitting molecules used in the simulation are illustrated in FIG. 9A. Through multiplication of the resultant EL emission spectrum by a spectral characteristic of each color of the color filter 18 illustrated in FIG. 10, an EL spectrum of each color pixel can be obtained. In this case, the structure is assumed to minimize the power consumption under the condition that the blue component has a luminous intensity CIE_y of 0.06. In Table 1, specific conditions for the organic layer 15 are shown. In Table 1, z, L, $\lambda_1$, and $\lambda_2$ were calculated on the assumption that a material for the organic layer has a refractive index of 2.05, $\varphi$ defined in Equation (1) is 0.77$\pi$, $\Sigma\varphi$ defined in Equation (2) is 1.37$\pi$, and m=1. The wavelength $\lambda_3$ was calculated on the assumption that the material for the organic layer has a refractive index of 1.90 and $\varphi'$ defined in Equation (3) is 0.82$\pi$.

TABLE 1

|  |  | Example |  | Comparative Example |  |  |
|---|---|---|---|---|---|---|
|  |  | 1 | 2 | 1 | 2 | 3 |
| Electron transporting layer thickness [nm] | | 123 | 120 | 123 | 119 | 115 |
| Light emitting layer | Fluorescent spectrum | FIG. 9A | | | | |
|  | Type | Blue light emitting layer | Blue light emitting layer | Long-wavelength light emitting layer | Long-wavelength light emitting layer | Red light emitting layer |
|  | Film thickness [nm] | 10 | 10 | 10 | 10 | 10 |
|  | Type | — | Spacer | — | Spacer | Green light emitting layer |
|  | Film thickness [nm] | 0 | 10 | 0 | 10 | 10 |
|  | Type | Long-wavelength light emitting layer | Long-wavelength light emitting layer | Blue light emitting layer | Blue light emitting layer | Blue light emitting layer |
|  | Film thickness [nm] | 10 | 10 | 10 | 10 | 10 |
| Hole transporting layer thickness [nm] | | 39 | 31 | 44 | 40 | 43 |
| z [nm] | | 100 | 105 | 90 | 82 | 88 |
| L [nm] | | 373 | 371 | 383 | 387 | 385 |
| z' [nm] | | 93 | 78 | 122 | 133 | 120 |
| $\lambda_1$ [nm] | | 522 | 543 | 469 | 426 | 458 |
| $\lambda_2$ [nm] | | 443 | 440 | 455 | 460 | 457 |
| $\lambda_3$ [nm] | | 454 | 380 | 593 | 649 | 584 |

TABLE 1-continued

Figure 9B:
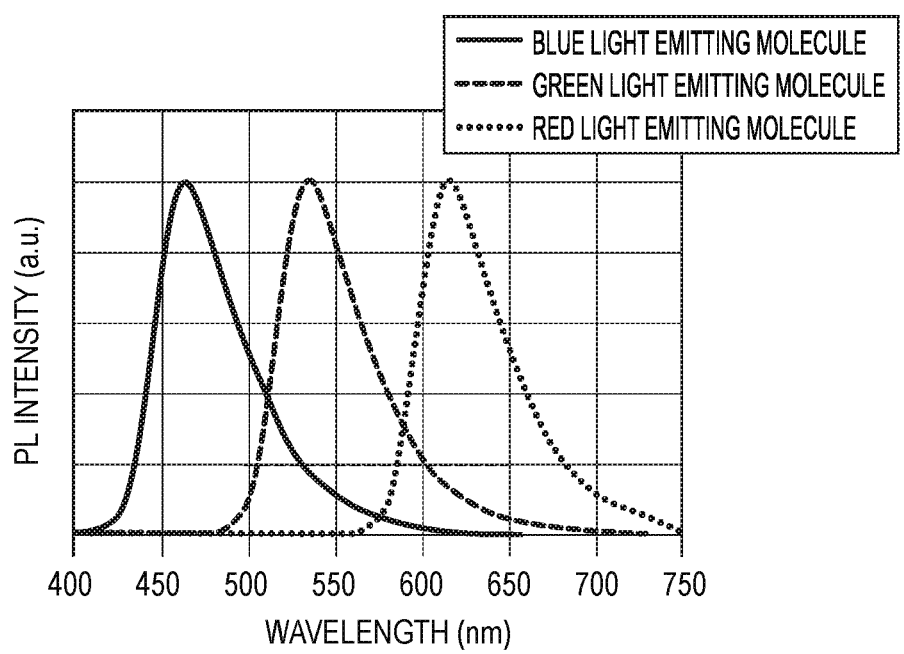
FIG. 9B is another graph for illustrating a fluorescence spectrum of each light emitting molecule used in simulation.

|  |  | Example | | Comparative Example | | |
|---|---|---|---|---|---|---|
|  |  | 3 | 4 | 4 | 5 | 6 |
| | Electron transporting layer thickness [nm] | 124 | 119 | 126 | 122 | 115 |
| Light emitting layer | Fluorescent spectrum | | | FIG. 9B | | |
| | Type | Blue light emitting layer | Blue light emitting layer | Long-wavelength light emitting layer | Long-wavelength light emitting layer | Red light emitting layer |
| | Film thickness [nm] Type | 10 — | 10 Spacer | 10 — | 10 Spacer | 10 Green light emitting layer |
| | Film thickness [nm] Type | 0 Long-wavelength light emitting layer | 10 Long-wavelength light emitting layer | 0 Blue light emitting layer | 10 Blue light emitting layer | 10 Blue light emitting layer |
| | Film thickness [nm] | 10 | 10 | 10 | 10 | 10 |
| Hole transporting layer thickness [nm] | | 43 | 36 | 46 | 42 | 47 |
| z [nm] | | 109 | 115 | 94 | 86 | 96 |
| L [nm] | | 383 | 379 | 394 | 398 | 394 |
| z' [nm] | | 101 | 87 | 125 | 137 | 127 |
| $\lambda_1$ [nm] | | 564 | 596 | 490 | 447 | 501 |
| $\lambda_2$ [nm] | | 455 | 450 | 467 | 472 | 467 |
| $\lambda_3$ [nm] | | 491 | 426 | 612 | 667 | 621 |

Power consumption and a color gamut were evaluated based on an EL spectrum obtained by each color pixel. The power consumption was estimated, on the assumption that a voltage level is constant, based on a brightness ratio between red, green, and blue for producing white (0.31, 0.33) with a certain brightness. The brightness ratio was derived from red chromaticity, green chromaticity, and blue chromaticity in each light. In this example, the power consumption was calculated as relative power consumption with respect to the power consumption of Comparative Example 1 that was set to 1.

Further, the viewing angle dependency was simulated on the assumption that light is emitted into the transparent sealing layer 17 at the angle of 30° with respect to the normal direction of the substrate. The color gamut in the front direction and color misregistration of white light caused by oblique emission were evaluated. Then, the viewing angle dependency was evaluated based on a change in color gamut. The color misregistration of white light caused by oblique emission was calculated as follows. That is, a current to be supplied to each pixel was set based on an intensity ratio between pixels at which white light was to be produced in the front direction. Then, a difference between the white chromaticity for the front direction and that for the oblique emission was evaluated based on a current ratio thereof. The difference is represented by $\Delta u'v'$.

Further, the long-wavelength light emitting layer 15b and the blue light emitting layer 15c were caused to emit light at an emission position close to the light extraction electrode 16 side, an emission position in a central portion of the layer, and an emission position close to the reflective electrode 13 side, to thereby obtain an average of characteristic values obtained at the respective positions. In Table 2, thus-obtained average values are shown.

TABLE 2

|  | Example 1 | | Example 2 | | Comparative Example 1 | | Comparative Example 2 | | Comparative Example 3 | |
|---|---|---|---|---|---|---|---|---|---|---|
|  | | | | | Angle | | | | | |
|  | 0° | 30° | 0° | 30° | 0° | 30° | 0° | 30° | 0° | 30° |
| Power consumption (a.u.) | 1.2 | — | 1.3 | — | 1.0 | — | 1.0 | — | 1.0 | — |
| Color gamut (NTSC) | 78.2% | 74.1% | 78.4% | 74.8% | 77.7% | 73.6% | 77.3% | 73.2% | 77.8% | 73.1% |
| Color misregistration of white light ($\Delta u'v'$) | — | 0.052 | — | 0.051 | — | 0.055 | — | 0.057 | — | 0.058 |

Example 2 and Comparative Examples 1, 2, and 3

An evaluation was performed in the same way as Example 1 except that the layer structure and film thickness of the organic layer 15 were changed as shown in Table 1. In Comparative Example 3, z' and $\lambda_3$ were calculated on the assumption that the green light emitting layer is a long-wavelength light emitting layer. Evaluation results thereof are shown in Table 2.

Examples 3 and 4 and Comparative Example 4, 5, and 6

An evaluation was performed in the same way as Example 1 except that a light emitting molecule that emits light having a fluorescence spectrum of FIG. 9B was used, the layer structure and the film thickness of the organic layer 15 were changed as shown in Table 1, and the relative power consumption was estimated on the assumption that the power consumption of Comparative Example 6 is set to 1. In Comparative Example 6, z' and $\lambda_3$ were calculated on the assumption that the green light emitting layer is a long-wavelength light emitting layer. Evaluation results thereof are shown in Table 3.

TABLE 3

|  | Example 3 | | Example 4 | | Comparative Example 4 | | Comparative Example 5 | | Comparative Example 6 | |
| --- | --- | --- | --- | --- | --- | --- | --- | --- | --- | --- |
| | | | | | Angle | | | | | |
| | 0° | 30° | 0° | 30° | 0° | 30° | 0° | 30° | 0° | 30° |
| Power consumption (a.u.) | 1.1 | — | 1.3 | — | 1.0 | — | 1.0 | — | 1.0 | — |
| Color gamut (NTSC) | 80.3% | 77.2% | 80.4% | 77.4% | 79.9% | 77.0% | 79.8% | 77.0% | 79.9% | 76.4% |
| Color misregistration of white light (Δu'v') | — | 0.049 | — | 0.047 | — | 0.052 | — | 0.053 | — | 0.056 |

According to Examples of the present invention, it was confirmed from the results in Table 2 and Table 3 that an NTSC value obtained in the front direction is increased and the value Δu'v' is reduced as compared with those of Comparative Examples, and that the organic white light emitting element according to this embodiment therefore ensures wide color gamut and improved viewing angle characteristics.

Moreover, similar effects were able to be confirmed also in a simulation example in which the reflective electrode 13 had an Al/Ti structure obtained by laminating a Ti film (60 nm) as a barrier layer on an Al thin film (10 nm). The organic white light emitting element according to the present invention enables a wide color gamut and an improvement in viewing angle dependency. Further, the element enables a simple process for manufacturing an element and thereby ensures an improvement in yield.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-126592, filed Jul. 3, 2018, which is hereby incorporated by reference herein in its entirety.

What is claimed is:

1. An organic white light emitting element comprising: a reflective electrode, an organic layer, and a light extraction electrode, which are formed in the stated order, wherein the organic layer includes:
   a blue light emitting layer including a light emitting molecule that emits blue light; and
   a long-wavelength light emitting layer including a light emitting molecule that emits red light and a light emitting molecule that emits green light,
   wherein the long-wavelength light emitting layer is arranged between the blue light emitting layer and the reflective electrode,
   wherein the blue light emitting layer is provided at such a position as to satisfy Equation (1) given below:

$$z = \varphi \times \lambda_1 / 4\pi \quad (1)$$

where
z represents an optical distance between the reflective electrode and an interface of the blue light emitting layer on the reflective electrode side, φ represents a phase of light reflected by the reflective electrode in an emission wavelength region of the blue light emitting layer, and
$\lambda_1$ represents a wavelength in a visible light region, and
wherein the organic white light emitting element has a resonator structure defined between the reflective electrode and the light extraction electrode and has a maximum peak resonant wavelength in a blue light wavelength region.

2. The organic white light emitting element according to claim 1, wherein the organic white light emitting element satisfies Equation (2) given below:

$$L = (\Sigma \varphi + 2m\pi) \times \lambda_2 / 4\pi \quad (2)$$

where L represents an optical distance between the reflective electrode and the light extraction electrode at a wavelength $\lambda_2$, Σλ represents sum of phases of light reflected by the reflective electrode and light reflected by the light extraction electrode at the wavelength $\lambda_2$, m is an integer of one of 0 and 1, and $\lambda_2$ represents the wavelength in the blue light wavelength region.

3. The organic white light emitting element according to claim 1, wherein the blue light wavelength region includes a peak emission wavelength of the blue light emitting layer.

4. The organic white light emitting element according to claim 1, wherein the blue light wavelength region is in a range of 430 nm or more and 490 nm or less.

5. The organic white light emitting element according to claim 1, wherein the organic layer has a physical film thickness of 150 nm or more and 220 nm or less.

6. The organic white light emitting element according to claim 1, wherein the wavelength $\lambda_1$ is equal to or longer than a peak emission wavelength of the blue light emitting layer, and a wavelength $\lambda_3$ is shorter than a peak emission wavelength of the green light emission molecule, the wavelength $\lambda_3$ being defined by Equation (3) given below:

$$z' = \varphi' \times \lambda_3 / 4\pi \quad (3)$$

where z' represents an optical distance between the reflective electrode and an interface of the long-wavelength light emitting layer on the light extraction electrode side, and φ' represents a phase of light reflected by the reflective electrode in an emission wavelength region of the light emitting molecule that emits green light.

7. The organic white light emitting element according to claim 1, wherein the wavelength $\lambda_1$ is more than a peak emission wavelength of the blue light emitting layer.

8. The organic white light emitting element according to claim 1, wherein the light extraction electrode is made of an Ag alloy.

9. A display apparatus comprising:
the organic white light emitting element of claim 1; and
a color filter.

10. An image pickup apparatus comprising:
an image pickup element; and
a display unit configured to display information obtained by the image pickup element,
the display unit including the display device of claim 9.

11. A mobile device comprising a display unit including the display device of claim 9.

12. A lighting apparatus comprising:
the organic white light emitting element of claim 1; and
a power supply circuit connected to the organic white light emitting element.

13. The organic white light emitting element according to claim 1,
wherein a blue light from the white light emitting element has a luminous intensity CIE_y of 0.06.

14. The organic white light emitting element according to claim 1, wherein the blue light emitting layer is in contact with the long-wavelength light emitting layer.

15. The organic white light emitting element according to claim 1 further comprising a second organic white light emitting element disposed next to the organic white light emitting element,
wherein the second organic white light emitting element includes a reflective electrode, an organic layer, and a light extraction electrode, and
wherein the organic layer extends continuously from the organic white light emitting element to the second white light emitting element.

16. The organic white light emitting element according to claim 15, wherein the blue light emitting layer is in contact with the long-wavelength light emitting layer.

17. The organic white light emitting element according to claim 15, wherein the organic layer of the organic white light emitting element has a same thickness as the organic layer of the second organic white emitting element.

* * * * *